US008557335B2

(12) United States Patent
Makela et al.

(10) Patent No.: US 8,557,335 B2
(45) Date of Patent: Oct. 15, 2013

(54) METHOD FOR MANUFACTURING AN EXTREMELY HYDROPHOBIC SURFACE

(75) Inventors: Milja Makela, Lahti (FI); Juha Kauppinen, Mikkeli (FI); Markku Rajala, Vantaa (FI)

(73) Assignee: Beneq Oy, Vantaa (FI)

( * ) Notice: Subject to any disclaimer, the term of this patent is extended or adjusted under 35 U.S.C. 154(b) by 686 days.

(21) Appl. No.: 12/741,691

(22) PCT Filed: Dec. 9, 2008

(86) PCT No.: PCT/FI2008/050718
§ 371 (c)(1),
(2), (4) Date: May 6, 2010

(87) PCT Pub. No.: WO2009/074715
PCT Pub. Date: Jun. 18, 2009

(65) Prior Publication Data
US 2010/0266761 A1    Oct. 21, 2010

(30) Foreign Application Priority Data

Dec. 10, 2007    (FI) ...................................... 20070955

(51) Int. Cl.
*B05D 1/36*    (2006.01)
*B05D 3/00*    (2006.01)

(52) U.S. Cl.
USPC ............................. 427/203; 427/299; 216/52

(58) Field of Classification Search
None
See application file for complete search history.

(56) References Cited

U.S. PATENT DOCUMENTS

| 3,354,022 | A | 11/1967 | Dettre et al. |
| 6,309,798 | B1 | 10/2001 | Reetz et al. |
| 6,468,916 | B2 | 10/2002 | Choi et al. |
| 6,811,856 | B2 | 11/2004 | Nun et al. |
| 6,852,390 | B2 | 2/2005 | Extrand |
| 6,997,018 | B2 | 2/2006 | Sakoske et al. |
| 2001/0007808 | A1* | 7/2001 | Mishima et al. ................ 451/38 |

(Continued)

FOREIGN PATENT DOCUMENTS

FI    117790 B    2/2007
WO    WO 2007/110481 A1    10/2007

OTHER PUBLICATIONS

Hinds, W.C., "Straight-Line Accerleration and Curvilinear Particle Motion," *Aerosol Technology, Properties, Behavior, and Measurement of Airborne Particles*, 1999, pp. 111-149, $2^{nd}$ Edition, John Wiley & Sons, Inc. New York, USA.

(Continued)

*Primary Examiner* — Michael Cleveland
*Assistant Examiner* — Joel Horning
(74) *Attorney, Agent, or Firm* — Oliff & Berridge, PLC

(57) ABSTRACT

The invention relates to a method and an apparatus for producing a hydrophobic surface on to a material. The invention involves directing at a surface to be structured a particle spray structuring the surface so as to structure the surface, and coating the structured surface with a hydrophobic material. According to the invention, particles larger than a determined size d2 are separated from the particle spray by at least one impaction nozzle, which particles are directed at the surface to be structured such that they collide with the surface to be structured, producing a structure thereon. Next, the structured surface is coated by a gas deposition method in which the structured surface is subjected to alternate surface reactions of starting materials.

16 Claims, 3 Drawing Sheets

(56) References Cited

U.S. PATENT DOCUMENTS

2003/0096083 A1    5/2003   Morgan et al.
2003/0152780 A1    8/2003   Baumann et al.
2004/0237590 A1   12/2004   Sakoske et al.
2005/0012975 A1    1/2005   George et al.
2005/0163917 A1    7/2005   Renn
2006/0246297 A1*  11/2006   Sakoske et al. ............... 428/426

OTHER PUBLICATIONS

Ou, J. et al., "Laminar drag reduction microchannels using ultrahydrophobic surfaces," *Physics of Fluids*, Dec. 2004, pp. 4635-4643, vol. 16, No. 12, published by the American Institute of Physics, USA.

Belloy, E. et al., "Powder blasting for three-dimensional microstructuring of glass," *Sensors and Actuators*, 2000, pp. 231-237, vol. 86, published by Elsevier Science B.V.

Herrmann C.F. et al., "Hydrophobic Coatings Using Atomic Layer Deposition and Non-Chlorinated Precursors," 17th *IEEE International Conference on Micro Electro Mechanical Systems*, Jan. 25-29, 2004.

Ma, M. et al., "Superhydrophobic Surfaces," *Current Opinion in Colloid and Interface Science*, 2006, pp. 193-202, vol. 11, published by Elsevier Ltd.

Finnish Search Report issued in Finnish Application No. 20070955 on Sep. 9, 2008 (with translation).

International Search Report issued in International Application No. PCT/FI2008/050718 on Mar. 26, 2009.

Written Opinion of the International Searching Authority issued in International Application No. PCT/FI2008/050718 on Mar. 26, 2009.

* cited by examiner

METHOD FOR MANUFACTURING AN EXTREMELY HYDROPHOBIC SURFACE

BACKGROUND OF THE INVENTION

The present invention relates to a method of producing an extremely hydrophobic surface according to the preamble of claim 1, and particularly to a method of producing an extremely hydrophobic surface on to a material, the method comprising directing at a surface to be structured a particle spray structuring the surface so as to structure the surface, and coating the structured surface with a hydrophobic material. The present invention further relates to an apparatus for producing an extremely hydrophobic surface according to the preamble of claim 17, and particularly to an apparatus for producing an extremely hydrophobic surface on to a material, the apparatus comprising a device for directing a particle spray at a surface to be structured so as to structure the surface, and coating means for coating the structured surface.

The structure of a surface plays an important role as far as the properties of several products are concerned. A known example is a Lotus surface wherein a hydrophobic surface is transformed into an extremely hydrophobic one because the surface is provided with bumps that are spaced at distances of 20 to 40 micrometres from one another and, further, because the entire surface contains wax crystals of 200 to 2000 nanometres in size. Most generally it can be stated that by changing the micro/nanostructure of a surface, an initially hydrophilic or hydrophobic surface may be transformed into an extremely hydrophilic or extremely hydrophobic surface. An extremely hydrophilic and/or extremely hydrophobic surface is economically significant when manufacturing self-cleaning surfaces or surfaces that stay easily clean.

In the present context, a superhydrophobic surface is defined as a surface where a contact angle of a water droplet is greater than 120°.

U.S. Pat. No. 3,354,022, published on 21 Nov. 1967, E.I. du Pont de Nemours and Company, discloses a water-repellent surface whose water-repellency is based on the surface being provided with bumps that are spaced at an average distance of at most 1000 micrometers from one another and that have a height of at least half the average distance.

U.S. Pat. No. 6,811,856 B2, published on 2 Nov. 2004, Creavis Gesellschaft für Technologie and Innovation GmbH, discloses a self-cleaning surface with a hydrophobic surface structure formed by means of differences in height on the surface which are produced by particles affixed to the surface. The particles are 20 to 500 nm in size.

In addition to self-cleanability, hydrophobic surfaces are significant in fluidics, particularly when trying to decrease flow resistance of channels. U.S. Pat. No. 6,852,390 B2, published on 8 Feb. 2005, Entegris, Inc., discloses an ultra-phobic surface produced by means of uniformly shaped differences of micro or nanoscale from the surface. In Physics of Fluids, vol. 16, no. 12, December 2004, Jia Ou, Blair Perot & Jonathan P. Rothstein, "Laminar drag reduction in micro-channels using ultrahydrophobic surfaces", pp. 4635 to 4643, it is shown that the flow resistance of a laminar flow channel may be substantially reduced if the surface of the flow channel has a uniform microscale structure.

Self-cleaning surfaces are of great economical importance e.g. in windows. U.S. Pat. No. 6,997,018 B2, published on 14 Feb. 2006, Ferro Corporation, discloses a method of micro- and nanostructuring a glass surface. The method is based on affixing inorganic particles having a diameter of less than 400 nm to the surface of the glass when the temperature of a glass product is within a range of 700 to 1200° C.

A surface may be structured either uniformly or nonuniformly, i.e. randomly. In practice, randomly structured surfaces are more relevant since they are less expensive to manufacture. Micro- and nanostructures have been manufactured onto surfaces by several methods, such as lithography, etching, micro-stamping, chemical vapor disposition (CVD), and physical vapor disposition (PVD).

U.S. Pat. No. 6,309,798 B1, published on 30 Oct. 2001, Studiengesellschaft Kohle mbH, discloses a lithographic method for nanostructuring a surface. The lithographic method requires multiphase surface processing, thus not being an advantageous method for structuring large surfaces.

U.S. Pat. No. 6,468,916 B2, published on 22 Oct. 2002, Samsung SDI Co., Ltd., discloses a method of forming a nano-sized surface structure. The method comprises several steps: forming a micro-structure, depositing a carbon polymer layer on top of the micro-structured surface, a first plasma etching process, creating a mask layer, and a second reactive etching. This method thus also requires multiphase surface processing, so it is not an advantageous method for structuring large surfaces.

The method described in U.S. Pat. No. 6,997,018 for structuring a surface of glass is a useful structuring method for large surfaces, but it is limited to structuring a glassy surface at a temperature of more than 700° C.

The prior art methods are incapable of producing an extremely hydrophobic surface onto large surfaces of a material. Furthermore, the known methods and devices are incapable of producing an extremely hydrophobic surface in a controlled and adjustable manner such that it could be utilizable in commercial-scale production. Thus, a need exists for such a method, which method would also be useful and advantageous for implementing large and optically impeccable surfaces.

BRIEF DESCRIPTION OF THE INVENTION

An object of the invention is thus to provide a method and an apparatus implementing the method so as to enable the aforementioned problems to be solved.

The object of the invention is achieved by a method according to the characterizing part of claim 1, characterized by comprising at least the following steps of:

separating from the particle spray, by means of at least one impaction nozzle, particles larger than a determined size $d_2$, and directing these particles at the surface to be structured such that they collide with the surface to be structured, producing a structure thereon; and coating the structured surface by using a gas deposition method in which the structured surface is subjected to alternate surface reactions of starting materials.

The object of the invention is further achieved by a device according to the characterizing part of claim 15, which is characterized in that the device for directing the particle spray at the surface to be structured comprises at least one impaction nozzle for separating particles larger than a determined size $d_2$ from the particle spray, and that the apparatus further comprises gas deposition means for subjecting the structured surface to alternate surface reactions of starting materials.

Preferred embodiments of the invention are disclosed in the dependent claims.

According to the invention, particles larger than a diameter $d_1$ may first be separated from a group of particles $G_o$ by an impactor. Next, the group of particles is led through a subsequent impactor nozzle, and particles larger than a diameter $d_2$ are allowed to collide with the surface to be modified, whereupon they provide the surface with a structure whose size depends on the diameters $d_1$ and $d_2$. The structure produced on the surface by means of the particles $d_2$ is at least a nano-structure, but it may also comprise both a nano-structure and a microstructure. Further, particles larger than a diameter $d_3$ may be separated from the same group of particles by means of the impactor, whereafter also particles larger than a diameter $d_4$ ($<d_3$) are separated and led through a subsequent impaction nozzle and allowed to collide with the surface to be modified, the particles providing the surface with a structure whose size depends on the diameters $d_3$ and $d_4$ and whose scale is smaller than that of the structure dependent on the diameters $d_1$ and $d_2$. Preferably, the structure may be produced on the surface of a moving web, which enables differently scaled structures to be produced onto the same surface during the same process. It is obvious to one skilled in the art that the structuring according to the method may also be produced in more than two phases and that the diameters $d_2$ and $d_3$ may also be equal in size. In accordance with the above, the method of the invention enables first a microstructure and subsequently a nanostructure to be produced onto a surface to be structured. This is achieved by appropriately selecting the size of the particles colliding with the surface to be structured at a given time. In such a case, a first impaction nozzle is used for separating from the particle spray particles larger than a determined size $d_2$, which particles are directed at the surface to be structured such that they collide with the surface to be structured and wear a substantially microstructure thereon, and a second impaction nozzle is used for separating from the particle spray particles larger than a determined size $d_4$, $d_4<d_2$, which particles are directed at the surface to be structured such that they collide with the surface to be structured and wear a substantially nanostructure thereon. In other words, in the device and method according to the present invention, impaction nozzles may be arranged in series such that in the first impaction nozzle, a rougher particle distribution is produced from the particle spray, wherefrom e.g. particles smaller than the size $d_2$ are led to a subsequent impaction nozzle used for producing a finer particle distribution, etc.

According to the method, the surface may be provided with a microstructure typically having a scale of 1 to 1000 micrometres and/or a nanostructure typically having a scale of 1 to 1000 nanometres. In the method, the particles that collide with the surface to be structured either wear a structure on the surface, in which case once the particles have collided with the surface to be structured they bounce off this surface, or, alternatively, at least some of the particles that collide with the surface to be structured become affixed thereto, depositing a structure on the surface to be structured. It is further to be noted that in some cases, wear and deposition of the surface to be structured may also take place at least partly simultaneously. The fact of whether surface structuring takes place by means of wear or deposition primarily depends on the surface material and secondarily on the properties of the particles used, such as the quantity of movement and the size of the particles.

After structuring, the product having the structured surface is placed in a gas deposition device, such as an atomic layer deposition device, wherein the structured surface is subjected to alternate surface reactions of starting materials such that a hydrophobic coating is deposited on the structured surface. A combined effect of the structure of the surface and the hydrophobicity of the coating makes the final surface extremely hydrophobic.

Preferably, the device according to the invention is integrated in a manufacturing or processing process of a product, such as a float glass manufacturing device, flat glass tempering device, sheet metal production or processing device, plastic film roller-to-roller processing device, plastic product extrusion process, ceramic tile production process or the like. It is obvious to one skilled in the art that these are only examples of a preferred manner of integrating the device and that they do not limit the use of the device according to the invention in other applications.

The method and apparatus implementing the method according to the present invention enable extremely hydrophobic surfaces to be produced in a controlled and adjustable manner. In addition, the invention enables production of extremely hydrophobic surfaces onto large surfaces and thus extremely hydrophobic surfaces to be produced on an industrial scale.

BRIEF DESCRIPTION OF THE DRAWINGS

The invention is now described in closer detail in connection with preferred embodiments and with reference to the accompanying drawings, in which.

DETAILED DESCRIPTION OF THE INVENTION

Figure 1:
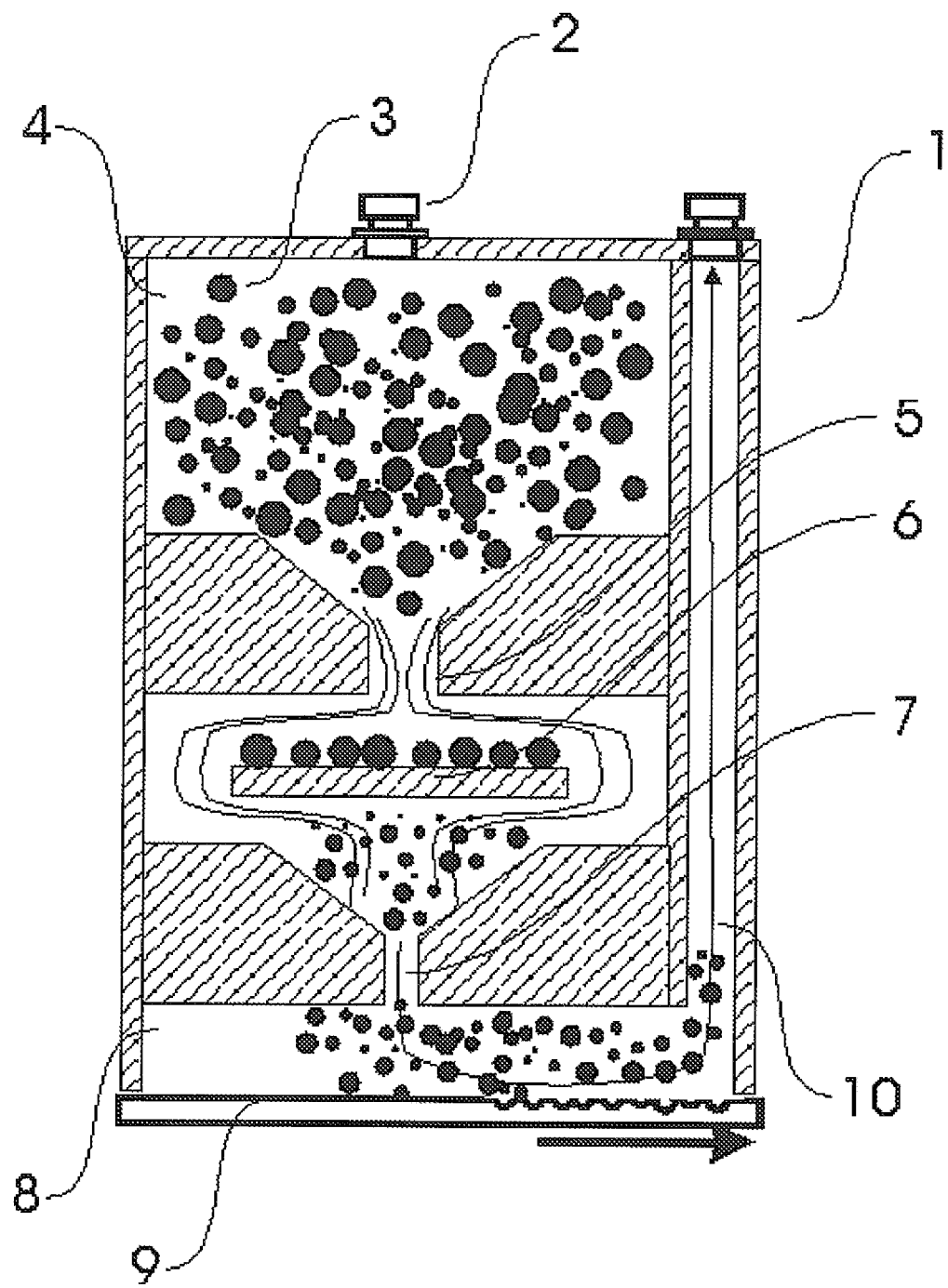
FIG. 1 shows an embodiment of the invention and illustrates a method of structuring a surface according to the invention.

FIG. 1 shows a schematic cross-section of a single-stage structuring device 1 according to an embodiment of the method according to the invention, the figure illustrating the method according to the invention. Preferably, the device 1 comprises means 2 for feeding an aerosol containing particles 3 into the device 1, means for controlling the pressure of the aerosol in a chamber 4 (not shown), an impaction nozzle 5, a collector substrate 6, means for conveying aerosol to another impaction nozzle 7, means 8 for conveying aerosol to a surface 9 to be structured, means 10 for conveying aerosol away from the surface 9 to be structured, and means for controlling the pressure of an aerosol discharge channel (not shown). In a simplest case, the flow rate of aerosol may serve as the pressure control but, when necessary, the pressure may be increased above the normal air pressure in the chamber 4, and/or the aerosol discharge channel 10 may have a pressure lower than the normal air pressure. The aerosol comprising particles 3 is fed to the chamber 4 of the device, the aerosol being led through the first impaction nozzle 5. The collector substrate 6 is arranged behind this first impaction nozzle 5 in the flow direction, on which substrate particles larger than size $d_1$ are caught/affixed while particles smaller than $d_1$ are forwarded to the second impaction nozzle 7 enabling particles larger than a determined size $d_2$ to be separated from a particle spray, these particles being conveyed to a surface 9 to be structured such that they collide with the surface 9 to be structured. The operation of an impaction nozzle is generally based on the fact that the velocity of particles passing through a nozzle gap of the impaction nozzle accelerates according to the properties of the particles and the dimensions and properties of the nozzle gap, whereby the particles obtain a certain quantity of motion while passing through the nozzle gap. When the downstream side of the nozzle is provided with a substrate towards which the particle spray from the impaction nozzle is directed, particles with sufficient kinetic energy collide with the surface of the substrate while particles with no sufficient quantity of motion are led away from the surface of the substrate such that they do not collide with the surface. Consequently, particles larger than a determined size D obtain a quantity of motion sufficient for them to collide with the substrate, whereas particles smaller than said size D do not collide with the substrate.

It is obvious to one skilled in the art that if an aerosol being fed to the device 1 contains no particles larger than the size $d_1$, the impaction nozzle 5 and the collector substrate 6 may be omitted from the device 1.

The aerosol to be supplied to the device 1 contains particles 3 whose shape may be arbitrary. Preferably, the shape of the particles differs from spherical and the surface of the particles is provided with edges or the like.

The mathematical equations set forth in the present application are from William C. Hinds, Aerosol Technology, Properties, Behavior, and Measurement of Airborne Particles, $2^{nd}$ Edition, John Wiley & Sons, Inc., New York, 1999.

The width of the gap of the impaction nozzle 5 is an essential parameter for collecting particles larger than the size $d_1$ onto the collector substrate 6. The collecting effectiveness $E_f$ of the collector substrate 6 depends on the Stokes number (Stk), which is determined for a rectangular gap of an impaction nozzle by:

$$Stk = \frac{\tau U}{H/2} = \frac{\rho_p d_p^2 U C_c}{9 \eta H} \quad (1)$$

wherein $\tau$ is relaxation time, U is gas velocity, H is the width of the gap of the impaction nozzle 6, $\rho_p$ is particle density, $d_p$ is particle diameter, $C_c$ is the Cunningham correction factor, and $\eta_7$ is viscosity. The gas velocity U is affected substantially by the pressure of the chamber 4 and the discharge channel 10.

If the particles are not spherical, the particle size of Equation 1 has to be corrected by a dynamic size factor $\chi$, which typically ranges between 1 and 2.

Particles smaller than particle size $d_1$ proceed to the impaction nozzle 7, wherein the velocity of the particles accelerates and particles larger than size $d_2$ collide with the surface 9 to be structured. The purpose of the method is that the particles colliding with the surface 9 to be structured bounce off the surface 9, leaving a mark on the surface 9, the mark structuring the surface, or, alternatively, become affixed to the surface 9, depositing a structure thereon. The phenomenon of a particle bouncing off a surface is more likely with larger particles and higher particle velocities and with particles consisting of hard materials. In order to wear the surface 9, it is preferable to use oxide particles, such as aluminium oxide, carbide particles, such as silicon carbide, or nitride particles, such as boron nitride, as the particles for the device 1. Further, the bouncing of particles off a surface is affected by the material and initial structure of the surface to be structured, and the use of the method is most preferable when the method is used for structuring smooth, hard and clean surfaces, e.g. a glass or metal surface. Consequently, the particles colliding with the surface to be structured produce at least a nanostructure onto the surface to be structured. In other words, in the present invention a nanostructure is produced by providing the surface to be structured with more material, or by removing material from the surface to be structured, or by modifying the surface to be structured by making particles collide therewith.

No bouncing of particles occurs if the particle velocity does not exceed a critical velocity $V_c$, which is defined by $$V_c = \frac{\beta}{d_a} \quad (2)$$

wherein b is a constant which depends on the materials used (particles and surface) and the geometry and which typically ranges from 1 to $100^x$ $10^{-6}$ $m^2/s$, and $d_a$ is the aerodynamic diameter of a particle.

Figure 2:
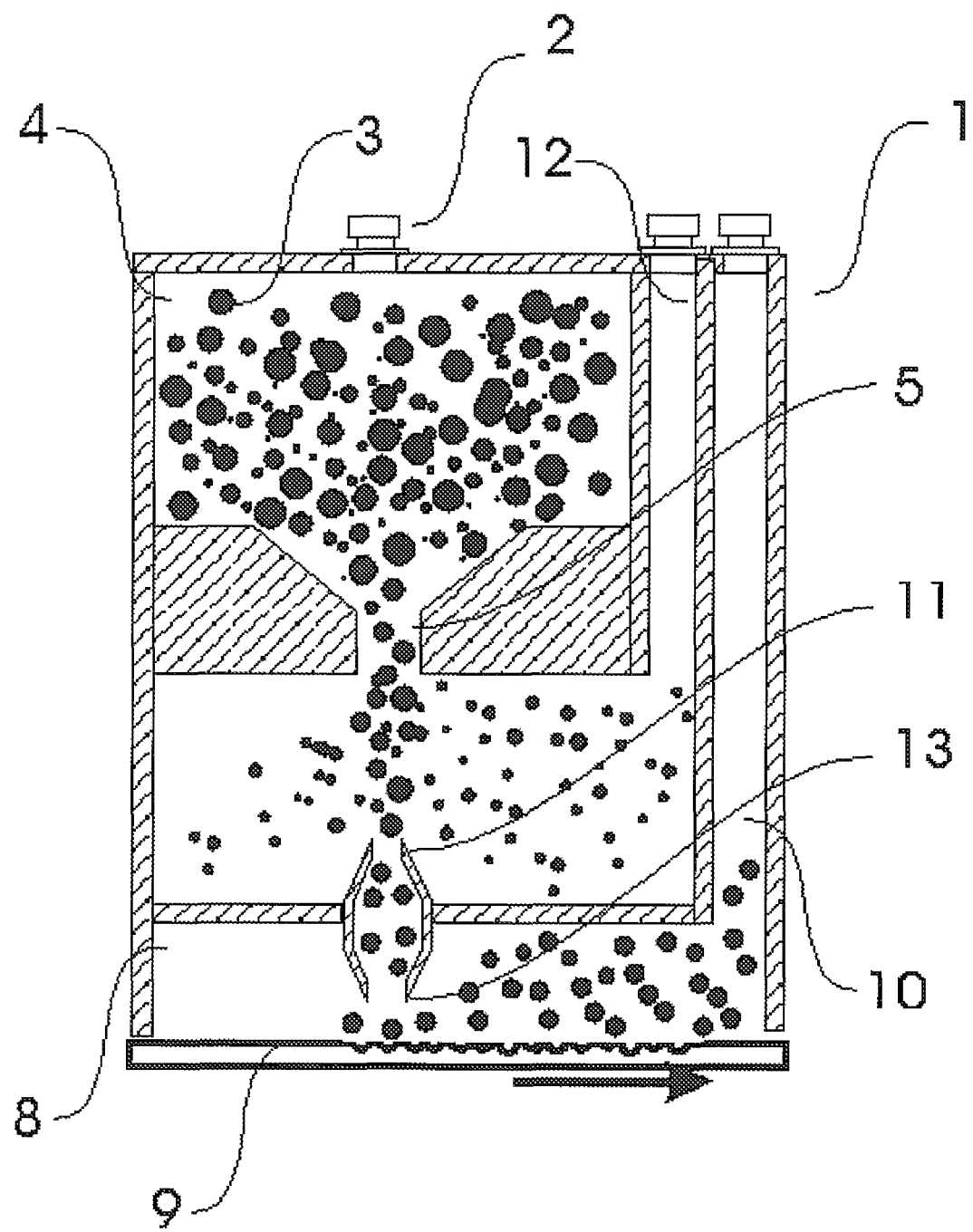
FIG. 2 shows another embodiment of the invention, wherein smallest particles are removed from an aerosol before structuring a surface.

FIG. 2 shows a schematic cross-section of a single-stage structuring device 1 according to another embodiment of the invention. Preferably, the device 1 comprises means 2 for feeding an aerosol containing particles 3 into the device 1, means for controlling the pressure of the aerosol in a chamber 4 (no pressure control means are depicted in the figure), a virtual impactor 11 which separates particles smaller and larger than the size $d_2$, means for conveying particles smaller than the particle size $d_2$ away from the device 12, means 8 for conveying aerosol to the surface 9 to be structured, means 10 for conveying aerosol away from the surface 9 to be structured, and means for controlling the pressure of the aerosol discharge channel (not shown). In a simplest case, the flow rate of the aerosol may serve as the pressure control but, when necessary, the pressure may be increased above the normal air pressure in the chamber 4, and/or the aerosol discharge channel 10 may have a pressure lower than the normal air pressure. The device according to this embodiment provides the advantage that particles smaller than the particle size $d_2$ can be removed from the gas flow before they collide with the surface 9 to be structured. Since a vast majority of the flow passes to the channel 12, an output 13 of the virtual impactor has been constricted in order to increase the velocity of the particles. In all embodiments, the velocity of the particles may be increased also e.g. by supplying an additional gas flow after the impaction nozzle, by means of an electric field or otherwise.

A structure to be produced by the method according to the invention onto a room-temperature glass or aluminium surface was studied by way of example. Spherical pieces having a diameter of 25 mm were manufactured from aluminium foil by a punching device, and the pieces were loaded into an impactor (ELPI), manufactured by Dekati Oy, for different impactor degrees within a size range of 30 nanometres to 10 micrometres. Further, in place of a standard collector substrate, the same impactor was provided with a custom-made collector substrate and in this collector substrate a spherical piece made of soda-glass was installed. Nano-sized aluminium oxide particles ($Al_2O_3$) were produced by a liquid flame spraying apparatus according to Finnish Patent No. 98832. In a liquid flame spray, a raw material solution was used wherein 64 g of aluminium nitrate was dissolved in 76 g of methanol. The solution was fed to the liquid flame spray at a velocity of 17 ml/min. Similarly, in order to produce a flame, hydrogen was fed to the liquid flame spray at a volume flow of 50 ml/min and oxygen at a volume flow of 25 l/min. The raw material solution evaporates and vaporizes in the liquid flame spray, producing small aluminium particles. Some of the particles were collected into the aforementioned impactor when the collecting distance was 100 mm from the front surface of the nozzle of the liquid flame spray. In a first measurement, a peak of size distribution of the particles was determined, the peak settling at about 110 nm. The aluminium substrates used in the measurement were recovered for SEM measurement. Next, the custom-made substrate and a glass sample were placed at the impactor settling at the size distribution peak, and an identical sample was run through the impactor. After the runs the samples were washed with a dish-washing agent and water. The samples were then analyzed by a scanning electron microscope, the magnification being 60 000× and the acceleration voltage being 10 kV. In accordance with the tests, it was observed that with the parameters according to the example, the method according to the invention produces scratches of about 100 nm in length and some nanometres in thickness onto the surface of the glass. No nano-sized particles become substantially affixed to the surface of the glass. According to the tests, it was observed in the aluminium surface processed by the method that the particles produced collided tightly with the relatively soft aluminium surface, producing a nanostructure thereon. In other words, the particles affixed to the aluminium surface, depositing a structure thereon.

The solutions disclosed in the aforementioned embodiments may be combined with one another, and it is possible to couple differentlydimensioned devices in series such that a first device produces a microstructure onto a surface and a second device produces a nanostructure on top of the microstructure. The method and device of the present invention are not restricted to the size of the particles used and/or the size of the particles directed at the surface to be structured since the wear in the surface to be structured caused by the particles colliding therewith or the structure being deposited on the surface depends on the material and properties of the surface to be structured as well as on the material and properties of the particles. Thus, the structure provided on each surface to be structured is a result of the combined effect of the properties of the particles colliding with the surface and the properties of the surface itself to be structured.

After structuring, the surface is coated by a gas deposition deposotion method wherein the structured surface is subjected to alternate surface reactions of starting materials. One such gas deposition method is an atomic layer deposition method. A hydrophobic coating may be produced by an atomic layer deposition (ALD) method e.g. through an aluminium compound and fluorine compound process, such as a TMA(trimethyl aluminium)/fluoroalkylsilane process. In the process, the temperature of a reaction chamber (Beneq TFS500 ALD-reactor) was 70° C., and the starting material temperatures were for fluoroalkylsilane $(CF_3(CF_2)7CH_2CH_2Si(OCH_3)_3)$ 50° C., TMA 20° C., and water 20° C. The process cycle was as follows:

$H_2O$ pulse 60 s
$N_2$ flushing pulse 60.5 s
20 cycles comprising:
   TMA pulse 250 ms
   $N_2$ flushing pulse 5.5 s
   $H_2O$ pulse 250 ms
   $N_2$ flushing pulse 5.5 s
TMA pulse 2 s
$N_2$ flushing pulse 500 ms
Fluoroalkylsilane pulse 20 min
$N_2$ flushing pulse 500 ms After coating, the product has an extremely hydrophobic surface produced by the method of the invention.

Figure 3:
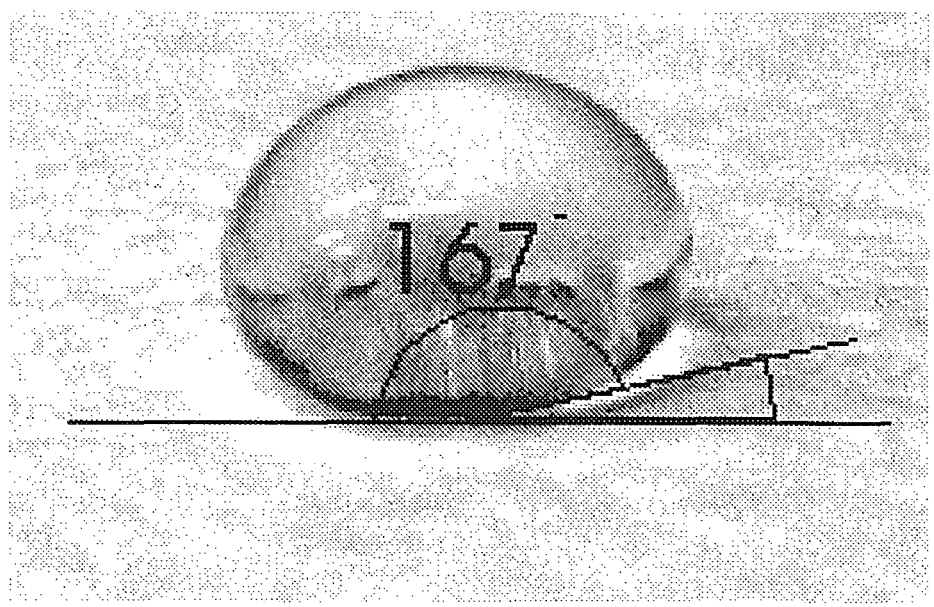
FIG. 3 shows hydrophobicity of a structured surface after ALD coating of the surface.

The hydrophobicity of the post-coating product may be demonstrated by setting a droplet of water on the surface. FIG. 3 shows that the contact angle of the droplet with respect to the surface is such that the surface is extremely hydrophobic.

The method and device according to the invention may be used for structuring a surface of glass by wearing when the surface of the glass is sufficiently hard. This condition is met when the temperature of the glass is below a lower cooling limit, e.g. in the case of soda-glass below 490° C. Hence, the device according to the invention may be integrated in the glass production line (float line) or at a point of the glass processing line where the temperature of the glass is below that lower cooling limit. It is to be noted that when the surface of the glass is soft, which condition is met when the temperature of the glass is higher than the cooling limit, the method according to the invention may be used for providing the surface of the glass with a structure which is not caused by a surface wearing effect, as in the case of hard glass, but by a nanomaterial depositing effect.

Preferably, the method according to the invention may also be used for structuring e.g. metal surfaces, e.g. when producing a nanostructured surface for a fingerprint rejecting metal surface.

It is obvious to those skilled in the art that as technology advances, the basic idea of the invention may be implemented in many different ways. The invention and its embodiments are thus not restricted to the above-described examples but may vary within the scope of the claims.

The invention claimed is:

1. A method of producing an extremely hydrophobic surface having a contact angle greater than 120 degrees on to a material, the method comprising directing at a surface to be structured a particle spray structuring the surface so as to structure the surface, and coating the structured surface with a hydrophobic material, wherein the method comprises at least the following steps of:

separating from the particle spray, by means of at least one impaction nozzle, particles larger than a determined size $d_2$, and directing these particles at the surface to be structured such that they collide with the surface to be structured, producing a structure thereon; and coating the structured surface by a gas deposition method in which the structured surface is subjected to alternate surface reactions of starting materials.

2. A method as claimed in claim 1, comprising coating the structured surface by an atomic layer deposition method.

3. A method as claimed in claim 1, comprising using at least an aluminium compound and a fluorine compound as starting materials of a coating agent to be deposited by the gas deposition method or the atomic layer deposition method.

4. A method as claimed in claim 3, wherein a raw material of the fluorine compound is a fluoroalkylsilane.

5. A method as claimed in claim 1, comprising separating from the particle spray, by means of at least one impaction nozzle, the particles larger than the determined size $d_2$, and directing these particles at the surface to be structured such that they collide with the surface to be structured, producing a nanostructure having a scale of 1 to 1000 nanometres and/or a microstructure having a scale of 1 to 1000 micrometres.

6. A method as claimed in claim 1, comprising directing the particles larger than the determined size $d_2$ at the surface to be structured such that they wear a structure thereon.

7. A method as claimed in claim 1, comprising directing the particles larger than the determined size $d_2$ at the surface to be structured such that at least some of them become affixed to the surface to be structured, depositing a structure thereon.

8. A method as claimed in claim 1, comprising separating from the particle spray particles larger than a determined size $d_1$, $d_1$ being larger than $d_2$, prior to separating the particles larger than the size $d_2$ from the particle spray.

9. A method as claimed in claim 1, comprising separating from the particle spray particles smaller than the determined size $d_2$ before the particles larger than the size $d_2$ collide with the surface to be structured.

10. A method as claimed in claim 1, comprising separating the particles smaller than the size $d_2$ by means of a virtual impactor.

11. A method as claimed in claim 1, comprising an average velocity of the particles larger than the determined size $d_2$ being higher than a critical velocity characteristic of these particles and the surface to be structured, particles moving at a velocity lower than the critical velocity becoming affixed to the surface to be structured.

12. A method as claimed in claim 11, comprising increasing the velocity of the particles larger than the determined size $d_2$ above the critical velocity by accelerating the velocity of the particles in the impaction nozzle or thereafter.

13. A method as claimed in claim 1, comprising the particles being used having a shape different from that of spherical particles.

14. A method as claimed in claim 1, comprising the particles being used being oxide, carbide or nitride particles.

15. A method as claimed in claim 1, comprising producing by the method first a microstructure and subsequently a nanostructure onto the surface to be structured.

16. A method as claimed in claim 15, comprising separating from the particle spray, by a first impaction nozzle, the particles larger than the determined size $d_2$, and directing these particles at the surface to be structured such that they collide with the surface to be structured and wear a substantially microstructure thereon, and separating from the particle spray, by a second impaction nozzle, particles larger than a determined size $d_4$, $d_4<d_2$, and directing these particles at the surface to be structured such that they collide with the surface to be structured and wear a substantially nanostructure thereon.

* * * * *